(12) United States Patent
Furuhjelm et al.

(10) Patent No.: US 7,743,290 B2
(45) Date of Patent: *Jun. 22, 2010

(54) STATUS OF OVERALL HEALTH OF NONVOLATILE MEMORY

(75) Inventors: Martin Ragnar Furuhjelm, Grass Valley, CA (US); Steffen Markus Hellmold, Novato, CA (US)

(73) Assignee: Lexar Media, Inc., Freemont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/276,699

(22) Filed: Nov. 24, 2008

(65) Prior Publication Data

US 2009/0077434 A1 Mar. 19, 2009

Related U.S. Application Data

(63) Continuation of application No. 10/927,871, filed on Aug. 27, 2004, now Pat. No. 7,464,306.

(51) Int. Cl.
*G11C 29/00* (2006.01)
*G11C 16/04* (2006.01)

(52) U.S. Cl. .................. 714/710; 365/185.33
(58) Field of Classification Search ......... 714/2, 714/41, 54, 724, 738, 739, 728; 365/185.33
See application file for complete search history.

(56) References Cited

U.S. PATENT DOCUMENTS

| | | | |
|---|---|---|---|
| 4,099,069 A | 7/1978 | Cricchi et al. |
| 4,130,900 A | 12/1978 | Watanabe |
| 4,210,959 A | 7/1980 | Wozniak |
| 4,309,627 A | 1/1982 | Tabata |
| 4,355,376 A | 10/1982 | Gould |
| 4,398,248 A | 8/1983 | Hsia et al. |
| 4,405,952 A | 9/1983 | Slakmon |
| 4,414,627 A | 11/1983 | Nakamura |
| 4,450,559 A | 5/1984 | Bond et al. |
| 4,456,971 A | 6/1984 | Fukuda et al. |
| 4,468,730 A | 8/1984 | Dodd et al. |
| 4,473,878 A | 9/1984 | Zolnowsky et al. |
| 4,476,526 A | 10/1984 | Dodd |

(Continued)

FOREIGN PATENT DOCUMENTS

AU   0 557 723   1/1987

(Continued)

OTHER PUBLICATIONS

Kai Hwang & Faye A. Briggs, *Computer Architecture and Parallel Processing*, McGraw-Hill Book Co., 1984, p. 64.

(Continued)

*Primary Examiner*—Phung M Chung
(74) *Attorney, Agent, or Firm*—Leffert Jay & Polglaze, P.A.

(57) ABSTRACT

A nonvolatile memory system includes nonvolatile memory organized into blocks, one or more of which are designated as spare blocks and one or more of which may be defective at the time of manufacturing of the nonvolatile memory. A controller device is coupled to the nonvolatile memory for measuring the health status of the nonvolatile memory by determining the number of growing defects on an on-going basis.

21 Claims, 7 Drawing Sheets

U.S. PATENT DOCUMENTS

| | | |
|---|---|---|
| 4,498,146 A | 2/1985 | Martinez |
| 4,525,839 A | 6/1985 | Nozawa et al. |
| 4,532,590 A | 7/1985 | Wallach et al. |
| 4,609,833 A | 9/1986 | Gutterman |
| 4,616,311 A | 10/1986 | Sato |
| 4,654,847 A | 3/1987 | Dutton |
| 4,710,871 A | 12/1987 | Belknap et al. |
| 4,746,998 A | 5/1988 | Robinson et al. |
| 4,748,320 A | 5/1988 | Yorimoto et al. |
| 4,757,474 A | 7/1988 | Fukushi et al. |
| 4,774,700 A | 9/1988 | Satoh et al. |
| 4,780,855 A | 10/1988 | Iida et al. |
| 4,788,665 A | 11/1988 | Fukuda et al. |
| 4,797,543 A | 1/1989 | Watanabe |
| 4,800,520 A | 1/1989 | Iijima |
| 4,829,169 A | 5/1989 | Watanabe |
| 4,843,224 A | 6/1989 | Ohta et al. |
| 4,896,262 A | 1/1990 | Wayama et al. |
| 4,914,529 A | 4/1990 | Bonke |
| 4,920,518 A | 4/1990 | Nakamura et al. |
| 4,924,331 A | 5/1990 | Robinson et al. |
| 4,943,745 A | 7/1990 | Watanabe et al. |
| 4,953,122 A | 8/1990 | Williams |
| 4,970,642 A | 11/1990 | Yamamura |
| 4,970,727 A | 11/1990 | Miyawaki et al. |
| 5,070,474 A | 12/1991 | Tuma et al. |
| 5,093,785 A | 3/1992 | Iijima |
| 5,168,465 A | 12/1992 | Harari |
| 5,198,380 A | 3/1993 | Harari |
| 5,200,959 A | 4/1993 | Gross et al. |
| 5,218,695 A | 6/1993 | Noveck et al. |
| 5,220,518 A | 6/1993 | Haq |
| 5,226,168 A | 7/1993 | Kobayashi et al. |
| 5,227,714 A | 7/1993 | Lou |
| 5,253,351 A | 10/1993 | Yamamoto et al. |
| 5,267,218 A | 11/1993 | Elbert |
| 5,268,318 A | 12/1993 | Harari |
| 5,268,870 A | 12/1993 | Harari |
| 5,270,979 A | 12/1993 | Harari et al. |
| 5,293,560 A | 3/1994 | Harari |
| 5,297,148 A | 3/1994 | Harari et al. |
| 5,303,198 A | 4/1994 | Adachi et al. |
| 5,305,276 A | 4/1994 | Uenoyama |
| 5,305,278 A | 4/1994 | Inoue |
| 5,315,541 A | 5/1994 | Harari et al. |
| 5,315,558 A | 5/1994 | Hag |
| 5,329,491 A | 7/1994 | Brown et al. |
| 5,337,275 A | 8/1994 | Garner |
| 5,341,330 A | 8/1994 | Wells et al. |
| 5,341,339 A | 8/1994 | Wells |
| 5,341,341 A | 8/1994 | Fukuzo |
| 5,353,256 A | 10/1994 | Fandrich et al. |
| 5,357,475 A | 10/1994 | Hasbun et al. |
| 5,359,569 A | 10/1994 | Fujita et al. |
| 5,365,127 A | 11/1994 | Manley |
| 5,369,615 A | 11/1994 | Harari et al. |
| 5,371,702 A | 12/1994 | Nakai et al. |
| 5,381,539 A | 1/1995 | Yanai et al. |
| 5,382,839 A | 1/1995 | Shinohara |
| 5,384,743 A | 1/1995 | Rouy |
| 5,388,083 A | 2/1995 | Assar et al. |
| 5,396,468 A | 3/1995 | Harari et al. |
| 5,404,485 A | 4/1995 | Ban |
| 5,406,527 A | 4/1995 | Honma |
| 5,418,752 A | 5/1995 | Harari et al. |
| 5,422,842 A | 6/1995 | Cernea et al. |
| 5,422,856 A | 6/1995 | Sasaki et al. |
| 5,428,621 A | 6/1995 | Mehrotra et al. |
| 5,430,682 A | 7/1995 | Ishikawa et al. |
| 5,430,859 A | 7/1995 | Norman et al. |
| 5,431,330 A | 7/1995 | Wieres |
| 5,434,825 A | 7/1995 | Harari |
| 5,438,573 A | 8/1995 | Mangan et al. |
| 5,465,235 A | 11/1995 | Miyamoto |
| 5,465,338 A | 11/1995 | Clay |
| 5,471,478 A | 11/1995 | Mangan et al. |
| 5,473,765 A | 12/1995 | Gibbons et al. |
| 5,479,638 A | 12/1995 | Assar et al. |
| 5,485,595 A | 1/1996 | Assar et al. |
| 5,490,117 A | 2/1996 | Oda et al. |
| 5,495,442 A | 2/1996 | Cernea et al. |
| 5,504,760 A | 4/1996 | Harari et al. |
| 5,508,971 A | 4/1996 | Cernea et al. |
| 5,513,138 A | 4/1996 | Manabe et al. |
| 5,515,333 A | 5/1996 | Fujita et al. |
| 5,519,847 A | 5/1996 | Fandrich et al. |
| 5,523,980 A | 6/1996 | Sakui et al. |
| 5,524,230 A | 6/1996 | Sakaue et al. |
| 5,530,673 A | 6/1996 | Tobita et al. |
| 5,530,828 A | 6/1996 | Kaki et al. |
| 5,530,938 A | 6/1996 | Akasaka et al. |
| 5,532,962 A | 7/1996 | Auclair et al. |
| 5,532,964 A | 7/1996 | Cernea et al. |
| 5,534,456 A | 7/1996 | Yuan et al. |
| 5,535,328 A | 7/1996 | Harari et al. |
| 5,541,551 A | 7/1996 | Brehner et al. |
| 5,544,118 A | 8/1996 | Harari |
| 5,544,356 A | 8/1996 | Robinson et al. |
| 5,552,698 A | 9/1996 | Tai et al. |
| 5,554,553 A | 9/1996 | Harari |
| 5,563,825 A | 10/1996 | Cernea et al. |
| 5,566,314 A | 10/1996 | DeMarco et al. |
| 5,568,439 A | 10/1996 | Harari |
| 5,572,466 A | 11/1996 | Sukegawa |
| 5,579,502 A | 11/1996 | Konishi et al. |
| 5,581,723 A | 12/1996 | Hasbun et al. |
| 5,583,812 A | 12/1996 | Harari |
| 5,592,415 A | 1/1997 | Kato et al. |
| 5,592,420 A | 1/1997 | Cernea et al. |
| 5,596,526 A | 1/1997 | Assar et al. |
| 5,598,370 A | 1/1997 | Niijima et al. |
| 5,602,987 A | 2/1997 | Harari et al. |
| 5,603,001 A | 2/1997 | Sukegawa et al. |
| 5,606,660 A | 2/1997 | Estakhri et al. |
| 5,611,067 A | 3/1997 | Okamoto et al. |
| 5,642,312 A | 6/1997 | Harari |
| 5,648,929 A | 7/1997 | Miyamoto |
| 5,663,901 A | 9/1997 | Wallace et al. |
| 5,693,570 A | 12/1997 | Cernea et al. |
| 5,712,819 A | 1/1998 | Harari |
| 5,719,808 A | 2/1998 | Harari et al. |
| 5,723,990 A | 3/1998 | Roohparvar |
| 5,734,567 A | 3/1998 | Griffiths et al. |
| 5,745,418 A | 4/1998 | Ma et al. |
| 5,754,567 A | 5/1998 | Norman |
| 5,757,712 A | 5/1998 | Nagel et al. |
| 5,758,100 A | 5/1998 | Odisho |
| 5,761,117 A | 6/1998 | Uchino et al. |
| 5,768,190 A | 6/1998 | Tanaka et al. |
| 5,768,195 A | 6/1998 | Nakamura et al. |
| 5,773,901 A | 6/1998 | Kantner |
| 5,778,418 A | 7/1998 | Auclair et al. |
| 5,781,478 A | 7/1998 | Takeuchi et al. |
| 5,787,445 A | 7/1998 | Daberko |
| 5,787,484 A | 7/1998 | Norman |
| RE35,881 E | 8/1998 | Barrett et al. |
| 5,799,168 A | 8/1998 | Ban |
| 5,802,551 A | 9/1998 | Komatsu et al. |
| 5,809,515 A | 9/1998 | Kaki et al. |
| 5,809,558 A | 9/1998 | Matthews et al. |
| 5,809,560 A | 9/1998 | Schneider |
| 5,818,350 A | 10/1998 | Estakhri et al. |
| 5,818,781 A | 10/1998 | Estakhri et al. |
| 5,822,245 A | 10/1998 | Gupta et al. |

| | | |
|---|---|---|
| 5,822,252 A | 10/1998 | Lee et al. |
| 5,822,781 A | 10/1998 | Wells et al. |
| 5,831,929 A | 11/1998 | Manning |
| 5,835,935 A | 11/1998 | Estakhri et al. |
| 5,838,614 A | 11/1998 | Estakhri et al. |
| 5,845,313 A | 12/1998 | Estakhri et al. |
| 5,847,552 A | 12/1998 | Brown |
| 5,860,083 A | 1/1999 | Sukegawa |
| 5,860,124 A | 1/1999 | Matthews et al. |
| 5,862,099 A | 1/1999 | Gannage et al. |
| 5,890,192 A | 3/1999 | Lee et al. |
| 5,901,086 A | 5/1999 | Wang et al. |
| 5,907,856 A | 5/1999 | Estakhri et al. |
| 5,909,586 A | 6/1999 | Anderson |
| 5,920,884 A | 7/1999 | Jennings, III et al. |
| 5,924,113 A | 7/1999 | Estakhri et al. |
| 5,928,370 A | 7/1999 | Asnaashari |
| 5,930,815 A | 7/1999 | Estakhri et al. |
| 5,933,368 A | 8/1999 | Ma et al. |
| 5,933,846 A | 8/1999 | Endo |
| 5,936,971 A | 8/1999 | Harari et al. |
| 5,937,425 A | 8/1999 | Ban |
| 5,953,737 A | 9/1999 | Estakhri et al. |
| 5,956,473 A | 9/1999 | Ma et al. |
| 5,959,926 A | 9/1999 | Jones et al. |
| 5,966,727 A | 10/1999 | Nishino |
| 5,974,544 A | 10/1999 | Jeffries et al. |
| 5,986,933 A | 11/1999 | Takeuchi et al. |
| 5,987,563 A | 11/1999 | Itoh et al. |
| 5,987,573 A | 11/1999 | Hiraka |
| 5,991,849 A | 11/1999 | Yamada et al. |
| 6,011,322 A | 1/2000 | Stumfall et al. |
| 6,011,323 A | 1/2000 | Camp |
| 6,018,265 A | 1/2000 | Keshtbod |
| 6,021,408 A | 2/2000 | Ledain et al. |
| 6,026,020 A | 2/2000 | Matsubara et al. |
| 6,026,027 A | 2/2000 | Terrell, II et al. |
| 6,034,897 A | 3/2000 | Estakhri et al. |
| 6,035,357 A | 3/2000 | Sakaki |
| 6,040,997 A | 3/2000 | Estakhri |
| 6,041,001 A | 3/2000 | Estakhri |
| 6,047,352 A | 4/2000 | Lakhani et al. |
| 6,055,184 A | 4/2000 | Acharya et al. |
| 6,055,188 A | 4/2000 | Takeuchi et al. |
| 6,069,827 A | 5/2000 | Sinclair |
| 6,072,796 A | 6/2000 | Christensen et al. |
| 6,076,137 A | 6/2000 | Asnaashari |
| 6,081,447 A | 6/2000 | Lofgren et al. |
| 6,081,878 A | 6/2000 | Estakhri et al. |
| 6,084,483 A | 7/2000 | Keshtbod |
| 6,097,666 A | 8/2000 | Sakui et al. |
| 6,115,785 A | 9/2000 | Estakhri et al. |
| 6,122,195 A | 9/2000 | Estakhri et al. |
| 6,125,424 A | 9/2000 | Komatsu et al. |
| 6,125,435 A | 9/2000 | Estakhri et al. |
| 6,128,695 A | 10/2000 | Estakhri et al. |
| 6,134,145 A | 10/2000 | Wong |
| 6,134,151 A | 10/2000 | Estakhri et al. |
| 6,141,249 A | 10/2000 | Estakhri et al. |
| 6,145,051 A | 11/2000 | Estakhri et al. |
| 6,151,247 A | 11/2000 | Estakhri et al. |
| 6,161,195 A | 12/2000 | Konishi et al. |
| 6,172,906 B1 | 1/2001 | Estakhri et al. |
| 6,173,362 B1 | 1/2001 | Yoda |
| 6,181,118 B1 | 1/2001 | Meehan et al. |
| 6,182,162 B1 | 1/2001 | Estakhri et al. |
| 6,202,138 B1 | 3/2001 | Estakhri et al. |
| 6,223,308 B1 | 4/2001 | Estakhri et al. |
| 6,226,708 B1 | 5/2001 | McGoldrick et al. |
| 6,230,234 B1 | 5/2001 | Estakhri et al. |
| 6,260,156 B1 * | 7/2001 | Garvin et al. .................. 714/8 |
| 6,262,918 B1 | 7/2001 | Estakhri et al. |
| 6,272,610 B1 | 8/2001 | Katayama et al. |
| 6,275,436 B1 | 8/2001 | Tobita et al. |
| 6,279,069 B1 | 8/2001 | Robinson et al. |
| 6,279,114 B1 | 8/2001 | Toombs et al. |
| 6,285,607 B1 | 9/2001 | Sinclair |
| 6,327,639 B1 | 12/2001 | Asnaashari |
| 6,345,367 B1 | 2/2002 | Sinclair |
| 6,374,337 B1 | 4/2002 | Estakhri |
| 6,385,667 B1 | 5/2002 | Estakhri et al. |
| 6,393,513 B2 | 5/2002 | Estakhri et al. |
| 6,397,314 B1 | 5/2002 | Estakhri et al. |
| 6,411,546 B1 | 6/2002 | Estakhri et al. |
| 6,467,021 B1 | 10/2002 | Sinclair |
| 6,490,649 B2 | 12/2002 | Sinclair |
| 6,567,307 B1 | 5/2003 | Estakhri |
| 6,578,127 B1 | 6/2003 | Sinclair |
| 6,587,382 B1 | 7/2003 | Estakhri et al. |
| 6,601,132 B2 | 7/2003 | Nomura et al. |
| 6,711,059 B2 | 3/2004 | Sinclair et al. |
| 6,721,819 B2 | 4/2004 | Estakhri et al. |
| 6,721,843 B1 | 4/2004 | Estakhri |
| 6,725,321 B1 | 4/2004 | Sinclair et al. |
| 6,728,851 B1 | 4/2004 | Estakhri et al. |
| 6,751,155 B2 | 6/2004 | Gorobets |
| 6,757,800 B1 | 6/2004 | Estakhri et al. |
| 6,772,274 B1 | 8/2004 | Estakhri |
| 6,813,678 B1 | 11/2004 | Sinclair et al. |
| 6,898,662 B2 | 5/2005 | Gorobets |
| 6,912,618 B2 | 6/2005 | Estakhri et al. |
| 6,950,918 B1 | 9/2005 | Estakhri |
| 6,957,295 B1 | 10/2005 | Estakhri |
| 6,973,519 B1 | 12/2005 | Estakhri et al. |
| 6,978,342 B1 | 12/2005 | Estakhri et al. |
| 7,000,064 B2 | 2/2006 | Payne et al. |
| 7,009,896 B2 * | 3/2006 | Yoon et al. .................. 365/200 |
| 7,171,536 B2 | 1/2007 | Chang et al. |
| 7,295,479 B2 * | 11/2007 | Yoon et al. .................. 365/200 |
| 7,464,306 B1 * | 12/2008 | Furuhjelm et al. .......... 714/710 |
| 2003/0033471 A1 | 2/2003 | Lin et al. |
| 2003/0161199 A1 | 8/2003 | Estakhri |
| 2003/0227451 A1 | 12/2003 | Chang |
| 2004/0255089 A1 | 12/2004 | Unno |
| 2005/0144516 A1 | 6/2005 | Gonzalez et al. |

FOREIGN PATENT DOCUMENTS

| | | |
|---|---|---|
| EP | 0 220 718 A2 | 5/1987 |
| EP | 0 243 503 A1 | 11/1987 |
| EP | 0 392 895 A2 | 10/1990 |
| EP | 0 424 191 A2 | 4/1991 |
| EP | 0 489 204 A1 | 6/1992 |
| EP | 0 522 780 A2 | 1/1993 |
| EP | 0 522 780 B1 | 1/1993 |
| EP | 0 544 252 A2 | 6/1993 |
| EP | 0 613 151 A2 | 8/1994 |
| EP | 0 617 363 A2 | 9/1994 |
| EP | 0 619 541 A2 | 10/1994 |
| EP | 0 663 636 A1 | 7/1995 |
| EP | 0 686 976 A2 | 12/1995 |
| EP | 0 897 579 B1 | 7/2000 |
| EP | 0 891 580 B1 | 11/2000 |
| EP | 0 896 669 B1 | 11/2000 |
| EP | 0 852 766 B1 | 5/2001 |
| EP | 0 852 765 B1 | 9/2001 |
| EP | 0 722 585 B1 | 5/2002 |
| EP | 0 910 826 B1 | 6/2002 |
| EP | 0 691 008 B1 | 11/2002 |
| EP | 0 861 468 B1 | 4/2003 |
| EP | 0 978 040 B1 | 5/2004 |
| EP | 1 157 328 B1 | 5/2005 |
| FR | 91 01908 | 8/1993 |
| GB | 2 251 323 A | 7/1992 |
| GB | 2 291 990 A | 2/1996 |
| GB | 2 291 991 A | 2/1996 |

| | | |
|---|---|---|
| GB | 2 297 637 A | 7/1996 |
| GB | 2 304 428 A | 3/1997 |
| GB | 2 348 991 | 12/2002 |
| GB | 2 351 822 | 1/2003 |
| GB | 2 384 337 | 7/2003 |
| GB | 2 384 883 | 10/2005 |
| GB | 2 384 338 | 11/2005 |
| GB | 2 384 072 | 12/2005 |
| GB | 2 411 499 | 2/2006 |
| IS | 117881 | 5/2003 |
| JP | 59-45695 | 9/1982 |
| JP | 58-21594 | 12/1983 |
| JP | 58-215795 | 12/1983 |
| JP | 59-092483 | 5/1984 |
| JP | 59-162695 | 9/1984 |
| JP | 60-212900 | 10/1985 |
| JP | 61-96598 | 5/1986 |
| JP | 62-283496 | 12/1987 |
| JP | 62-283497 | 12/1987 |
| JP | 63-183700 | 7/1988 |
| JP | 1-138694 | 5/1989 |
| JP | 3-228377 | 10/1991 |
| JP | 4-057295 | 2/1992 |
| JP | 4-254994 | 9/1992 |
| JP | 4-268284 | 9/1992 |
| JP | 4-278297 | 10/1992 |
| JP | 4-332999 | 11/1992 |
| JP | 5-128877 | 5/1993 |
| JP | 5-282883 | 10/1993 |
| JP | 6-004399 | 1/1994 |
| JP | 6-036578 | 2/1994 |
| JP | 6-124175 | 5/1994 |
| JP | 6-124231 | 5/1994 |
| JP | 6-131889 | 5/1994 |
| JP | 6-132747 | 5/1994 |
| JP | 6-149395 | 5/1994 |
| JP | 6-266596 | 9/1994 |
| JP | 7-084871 | 3/1995 |
| JP | 7-093499 | 4/1995 |
| JP | 7-114499 | 5/1995 |
| JP | 7-141258 | 6/1995 |
| JP | 7-235193 | 9/1995 |
| JP | 7-311708 | 11/1995 |
| JP | 7-334996 | 12/1995 |
| JP | 8-018018 | 1/1996 |
| JP | 8-069696 | 3/1996 |
| JP | 9-147581 | 6/1997 |
| SU | 1388877 | 4/1988 |
| SU | 1408439 | 7/1988 |
| SU | 1515164 | 10/1989 |
| SU | 1541619 | 2/1990 |
| SU | 1573458 | 6/1990 |
| SU | 1686449 | 10/1991 |
| WO | WO 84/00628 | 2/1984 |
| WO | WO 94/20906 | 9/1994 |

OTHER PUBLICATIONS

Walter Lahti and Dean McCarron, "State of the Art: Magnetic VS Optical Store Data in a Flash", *Byte Magazine*, Nov. 1, 1990. 311, vol. 15, No. 12.

Ron Wilson, Technology Updates, Integrated Circuits, "I-Mbit flash memories seek their role in system design", *Computer Design* 28 (Mar. 1, 1989) No. 5, Tulsa OK, US, pp. 30 and 32.

S. Mehoura et al., SunDisk Corporation, Santa Clara, CA. R.W. Gregor et al., AT&T Bell Laboratories, Allentown, PA. 1992 Symposium of VLSJ Circuits Digest of Technical Papers, "EEPROM for Solid State Disk Applications", pp. 24 and 25.

Mendel Rosenblum and John K. Ousterhout, "The Design and Implementation of a Log-Structured File System," 1991, 15 pgs., Berkeley, USA.

Brian Dipert and Markus Levy, *Designing with Flash Memory*, Annabooks, Apr. 1994, 445 pgs.

Science Forum, Inc. "Flash Memory Symposium '95", 1995, 13 pgs. Tokyo.

Ross S. Finlayson and David R. Cheriton, "An Extended File Service Exploiting Write-Once Storage," *ACM Symposium on Operating Systems Principles*, 1987, 10 pgs.

Jason Gait, "The Optical File Cabinet: A Random-Access File System for Write-Once Storage", *Computer*, Jun. 1988, 12 pgs.

Henry G. Baker, *Memory Management*, 1995, Springer-Verlag Heidelberg, Germany, 19 pgs.

Sape J. Mullender and Andrew S. Tanenbaum, "A Distributed File Service Based on Optimistic Concurrency Control", *ACM Press*, 1985, 12 pgs. New York, New York.

Hiroshi Nakamura, Junichi Miyamoto, Kenichi Imamiya and Yoshihisa Iwata, "A Novel Sense Amplifier for Flexible Voltage Operation NAND Flash Memories", VLSI Circuits, 1995, *Digest of Technical Papers*, 2 pgs.

Hiroshi Nakamura, Junichi Miyamoto, Kenichi Imamiya, Yoshihisa Iwata and Hideko Oodaira, "A Novel Sensing Scheme with On-Chip Page Copy for Flexible Voltage NAND Flash Memories", *IEICE Transactions on Electronics*, vol. E79-C, No. 6, pp. 836-844.

Takaaki Nozaki, Toshiaki Tanaka, Yoshiro Kijiya, Eita Kinoshita, Tatsuo Tsuchiya and Yutaka Hayashi, "A 1-Mb EEPROM with MONOS Memory Cell for Semiconductor Disk Application", *Journal of Solid-State Circuits*, vol. 26, No. 4, 5 pgs.

Kai Hwang and Faye A. Briggs, *Computer Architecture and Parallel Processing*, 1984, McGraw-Hill, Inc.

Ron Wilson, "Integrated Circuits; 1-Mb flash memories seek their role in system design", Mar. 1, 1989, 2 pgs. Tulsa, OK.

S. Mehroura, J.H. Yuan, R.A. Cemea, W.Y. Chien, D.C. Guteman, G. Samachisa, R.D. Norman, M. Mofidi, W. Lee, Y. Fong, A. Mihnea, E. Hann, R.W. Gregor, E.P. Eberhardt, J.R. Radosevich, K.R. Stiles, R.A. Kohler, C.W. Leung, and T.J. Mulrooney, "Serial 9Mb F EEPROM for Solid State Disk Applications", symposium, 2 pgs., 1992, Mountain View, CA.

Steven H. Leibson, "Nonvolatile, In-Circuit-Reprogrammable Memories", *EDN Special Report*, Jan. 3, 1991, No. 12, 12 pgs.

Walter Lahti and Dean McCarron, "State of the Art: Magnetic vs. Optical Store Data in a Flash", *Byte Magazine*, 1990, vol. 15, No. 12, 7 pgs.

Ramon Caceres, Fred Douglis, Kai Li and Brian Marsh, "Operating System Implications of Solid-State Mobile Computers", *Workshop on Workstation Operating Systems*, Oct. 1993, pp. 21-27.

Michael Wu and Wily Zwaenepoel, "A Non-Volatile, Main Memory Storage System", *ACM Press*, 1994, 12 pgs., San Jose, CA.

Dave Bursky, "Innovative flash memories match DRAM densities: available with a choice of features, flash memories are finding homes in many systems (including related articles on the origins of flash, and on the differences between NAND and NOR flash memories)", *Electronic Design*, May 16, 1994, vol. 42, No. 10, 9 pgs.

Anthony Cataldo, "New flash enhancements up ante. (Intel's 28F400BV-120 and 28F004BV-120, Atmel's AT29BV010 and AT29BV020, and Samsung Semiconductor's KM29V3200 flash memory devices)" (product announcement), *Electronic News*, Mar. 13, 1995, vol. 41, No. 2056, 4 pgs.

Sam Weber, "Flash modules' portability, reusability, small size valued for a host of APPs-Consumer formats flocking to flash", *Electronic Engineering Times*, Jul. 22, 1996, No. 911, 9 pgs.

Stan Baker, "But Integration Calls for Hardware, Software Changes: Flash designers face the dawn of a new memory age", *Electronic Engineering Times*, Dec. 3, 1990, vol. 41, No. 619, 5 pgs.

Toshiba, MOS Memory (Non-Volatile), 1995, Data Book.

Toshiba, Toshiba MOS Digital Integrated Circuit Silicon Gate CMOS, (TC58NS512DC), Mar. 21, 2001, 43 pgs., Data Book.

Toshiba, Toshiba Corporation, SMIL (Smartmedia Interface Library) Hardware Edition Version 1.00, Jul. 1, 2000, 136 pgs., Data Book.

Toshiba, Toshiba MOS Digital Integrated Circuit Silicon Gate, (TC58512FT), Mar. 5, 2001, 43 pgs., Data Book.

Toshiba, Toshiba MOS Digital Integrated Circuit Silicon Gate, (TC58DVM92A1FT00), Jan. 10, 2003, 44 pgs., Data Book.

Toshiba, Toshiba MOS Digital Integrated Circuit Silicon Gate, (TC58DVG02A1FT00), Jan. 10, 2003, 44 pgs., Data Book.

Toshiba, Toshiba MOS Digital Integrated Circuit Silicon Gate, (TC58100FT), Mar. 5, 2001, 43 pgs., Data Book.

Toshiba, MOS Memory (Non-Volatile), 1996, 279 pgs., Data Book.

"Fifth Biennial Nonvolatile Memory Technology Review," 1993 Conference, Jun. 22-24, 1993, Linthicum Heights, MD, USA.

Dan Auclair, "Optimal Solid State Disk Architecture for Portable Computers", Silicon Valley PC Design Conference, Jul. 9-10, 1991, pp. 811-815.

* cited by examiner

GOOD　　　　　　　　　　　　　　　　BAD

GOOD　　　　　　　　　　　　　　　　BAD

STATUS OF OVERALL HEALTH OF NONVOLATILE MEMORY

RELATED APPLICATION

This application is a continuation of U.S. application Ser. No. 10/927,871, titled "STATUS OF OVERALL HEALTH OF NONVOLATILE MEMORY," filed Aug. 27, 2004 now U.S. Pat. No. 7,464,306 (allowed), which is commonly assigned and incorporated in its entirety herein by reference.

FIELD

This invention relates generally to the field of nonvolatile or flash or EEPROM memory and in particular to a method and apparatus for measuring and displaying the health status of such memory.

BACKGROUND

Nonvolatile memory, such as FLASH memory and EEPROM, has gained notoriety in the recent decade, namely due to its fast write time characteristics and ability to maintain storage of information even when no power is connected thereto. Nonvolatile memory is now employed in a wide number of applications, such as digital film for digital cameras, as a drive (or mass storage) in personal computers (PCs) or other hosts, hand-held electronic devices such as personal data access (PDAs) and the like.

During manufacturing of nonvolatile memory devices, certain defects within the memory are detected and marked accordingly. Manufacturing defects are inherent in nonvolatile memory devices and other types of defects arise during use of the devices. Other types of defects can and generally result from repeated usage of the device. For example, a nonvolatile memory device is now generally expected to be used or re-written thereto anywhere from thousands to tens of thousands to hundreds of thousands to one million times and thereafter, the device typically becomes unusable due to the number of defective memory locations therein. As nonvolatile memory is utilized, it is written thereto for use in storing information and then it is erased prior to use of the same locations, i.e. re-written. In most applications, nonvolatile memory is organized into blocks and when a write is initiated by a host that is coupled to the memory, generally through a controller device, one or more blocks are written thereto. Prior to re-writing the one or more blocks, the latter need be erased and when a block undergoes anywhere from thousands to tens of thousands to hundreds of thousands to one million or so write and erase operations, it will generally become defective or its ability to store information reliably deteriorates. Thus, the more nonvolatile or flash memory is utilized, the more defects grow.

Through the use of the controller device coupling nonvolatile memory devices to a host, the defects within the devices are managed by replacing use of the detected defective blocks with blocks from a list of spare blocks. That is, firmware or software code being executed by the controller device causes such a replacement so that when a block, noted to be defective is in some manner, is accessed by a host, such access occurs of a replacement or spare block with the host generally remaining oblivious thereto. Thus, the controller device must maintain a list of spare blocks and a mapping of the defective blocks, if any, to spare blocks in replacement thereof.

However, currently, while the controller device is aware of the number of defective blocks and the number of spare blocks and the number of blocks being employed for storage, or in essence, status of the health of a nonvolatile memory device, the user of the latter and the host remain ignorant of such information. Additionally, the health status of nonvolatile memory devices is not readily shown or displayed to a host or user thereof.

Therefore, the need arises for a method and apparatus to measure and display the health status of nonvolatile or flash memory.

IN THE DRAWINGS

FIG. 1 shows a nonvolatile memory system 10 including a host 12 and a device 16 through an interface 14 in accordance with an embodiment of the present invention.

FIG. 2 shows the system 10 of FIG. 1 with the host sending an inquiry to the device 16, through the interface 14.

FIG. 3 illustrates the system 10 further including a monitor or display 18 coupled to the host 12, FIG. 4 shows further details of the device 16 in accordance with an embodiment of the present invention.

FIG. 4(a) shows the system 10 in accordance with another embodiment or the present invention wherein the host 12 is coupled to the display 19 for showing HS at 21 without the need for a controller.

DETAILED DESCRIPTION

Figure 1:
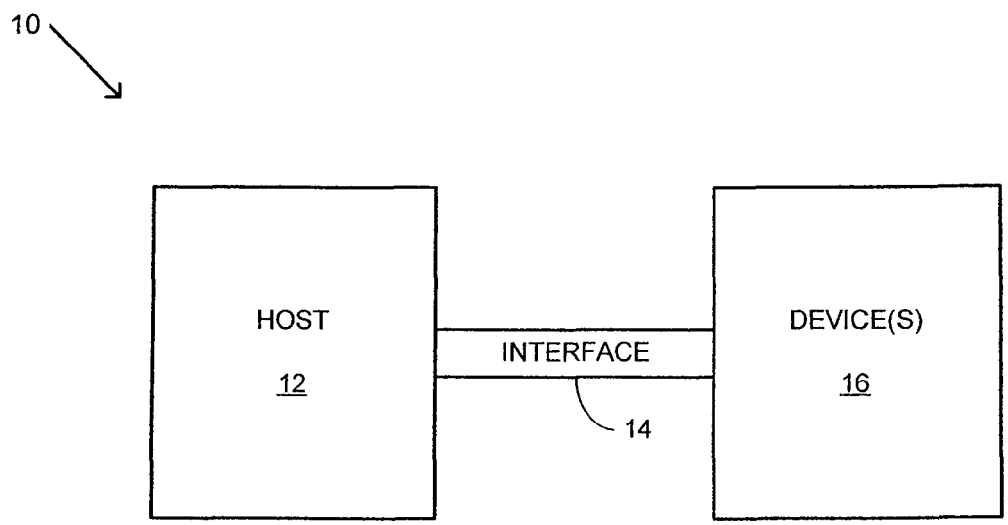

Referring now to FIG. 1, a nonvolatile memory system 10 is shown to include a host 12 and a device 16 through an interface 14 in accordance with an embodiment of the present invention. The host 12 may be any number of electronic systems or devices, such a personal computer (PC), a server, a digital camera and the like. The device 16, while not shown in FIG. 1, includes a controller device coupled to one or more nonvolatile memory devices. The controller transfers digital information between the host 12 and the nonvolatile memory devices. The nonvolatile memory devices store information transferred by the host upon direction from the controller device and can include any type of nonvolatile memory, such as flash memory, EEPROM memory or the like. The interface 14 can be any of the known interfaces currently being employed and adopted by the industry at large, such as a Universal Serial Bus (USB) interface, a small computer systems interface (SCSI), firewire and the like.

As noted earlier, there is currently no method and apparatus indicative of the health status of the nonvolatile memory device(s) within the device 16. Thus, a user of the system 10 and the host 12 remain unaware of the number of defective blocks or usable blocks included within the nonvolatile memory. However, in the embodiment of FIG. 1 and further of those that follow, the host 12 and/or a user of the system 10 are aware of the health of the nonvolatile memory within the device 16, as will be evident shortly.

Figure 2:
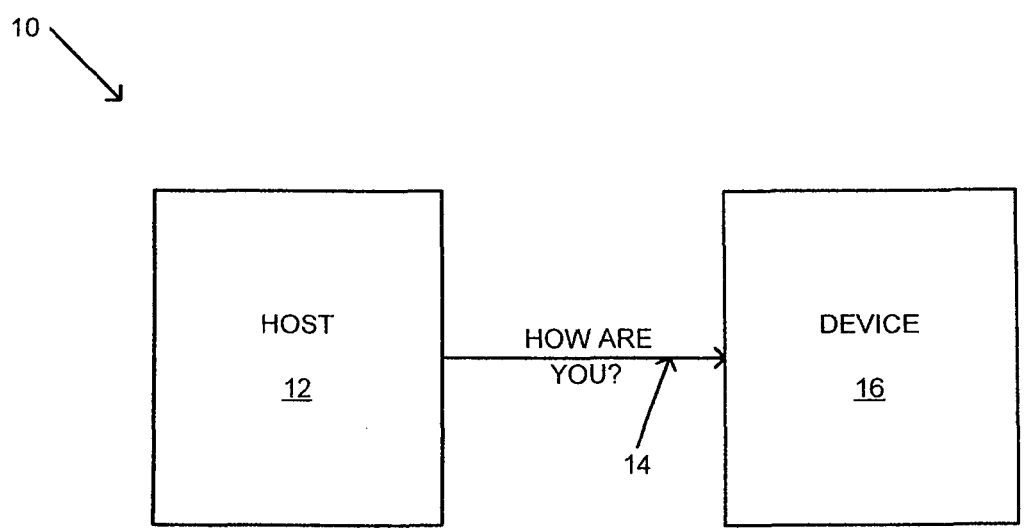

FIG. 2 shows the system 10 of FIG. 1 with the host sending an inquiry to the device 16, through the interface 14, which basically asks the device 16 about its health status, specifically the health of the nonvolatile memory included therein.

Figure 3:
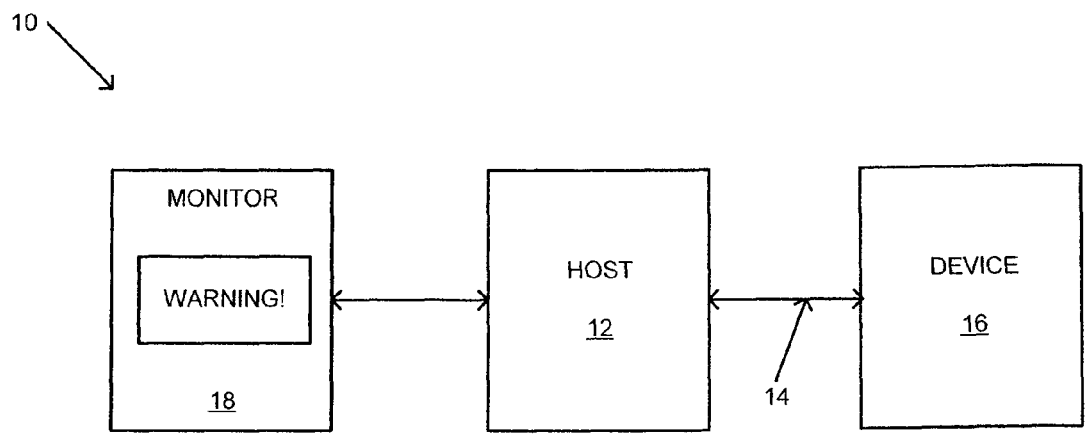

FIG. 3 shows the system 10 further including a monitor or display 18 coupled to the host 12, which receives a response from the device 16 regarding the health status of the nonvolatile memory included therein and displays the same on the monitor 18. As an example, the monitor 18 is caused to display a "Warning!" regarding the health of the nonvolatile memory, i.e. the latter may not be usable much longer.

Figure 4:
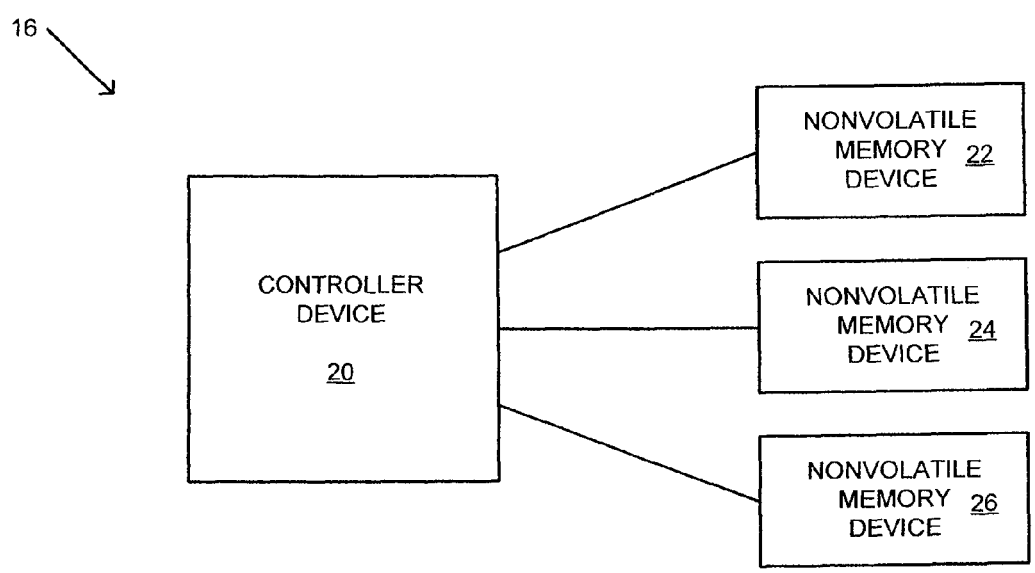

FIG. 4 shows further details of the device 16 in accordance with an embodiment of the present invention. The device 16 is shown to include a controller device 20 coupled to the nonvolatile memory devices 22-26. There may be a larger number of memory devices than those shown in FIG. 4. The devices 22-26 each include nonvolatile memory organized in blocks with each block having one or more sectors for storing sector information received from the host 12. During manufacturing, the nonvolatile memory of the devices 22-26 include certain defective blocks, which are detected and noted by the controller device 20 to avoid use thereof. As the nonvolatile memory is employed further, other defects develop or grow resulting in the deterioration of the health of the nonvolatile memory.

While not shown, the controller device 20 is coupled to the host 12 of FIGS. 1-3, which initiate a read or write operation through the controller device 20. After the first write operation of any of the locations within the devices 22-26, any further write operations need to be preceded by an erase operation. Accordingly, the life span of the nonvolatile memory of the devices 22-26 is limited. Generally, such a life expectancy is on the order of anywhere from thousands to tens of thousands to hundreds of thousands to one million write or store operations.

As earlier noted, each of the nonvolatile memory devices 22-26 includes blocks for storage of sector information from the host. The host addresses or identifies sectors to be stored or written via logical block address and the controller device 20 translates these logical block addresses into physical block addresses or virtual physical block addresses for identifying the blocks within the nonvolatile memory wherein sector information is to be stored or read therefrom.

Figure 4A:
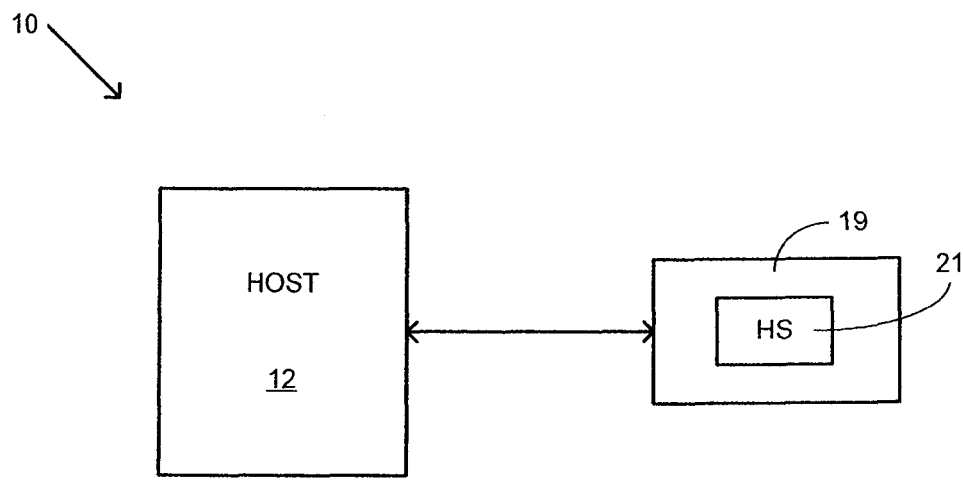

FIG. 4(a) shows the system 10 in accordance with another embodiment or the present invention wherein the host 12 is coupled to a display 19 for showing HS at 21 without the need for a controller. The display 19 may be a monitor or a window on a flash or nonvolatile memory card and HS, at 21, may be displayed in various ways, as will be discussed with respect to additional figures.

An example of a grid of blocks is shown in FIGS. 5-11 and for some blocks, status thereof. Specifically, in these figures, an example of a twenty four blocks is shown within the device 22. That is, a group of blocks 34 is shown to include twenty four blocks, such as a block 30 and a block 32 and in FIGS. 6-11, the status of these blocks is shown to change as defects are noted and grow. FIGS. 5-11 merely shown an example one of the ways in which a method and apparatus of the present invention may be employed, it should be understood that there are many other ways of implementing the various embodiments of the present invention.

Figure 5:
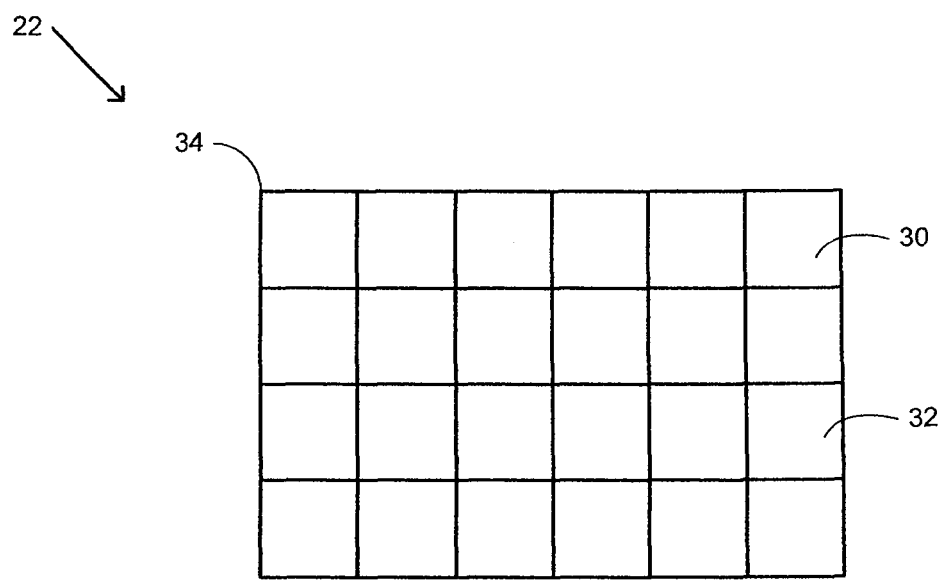
FIGS. 5-11 show examples of a grid of blocks and for some blocks, status thereof.
Figure 6:
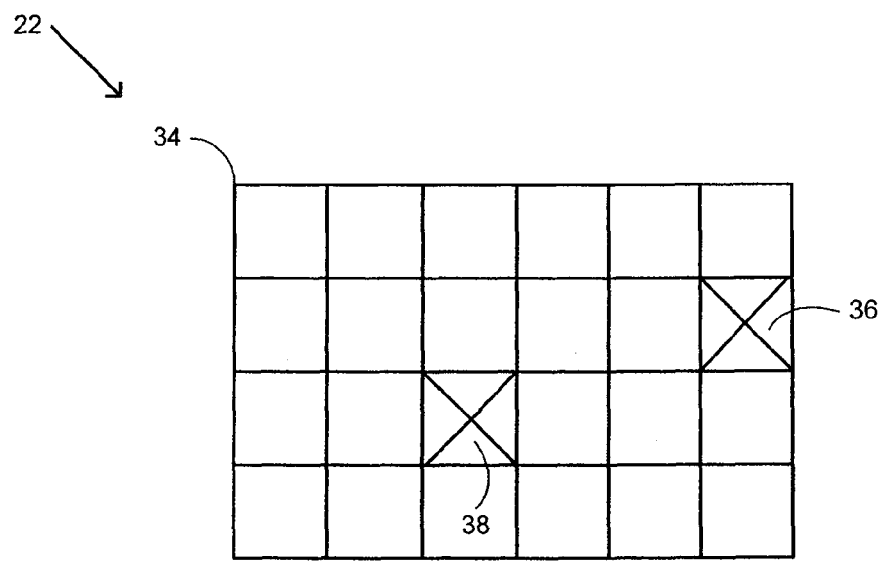

Starting with FIG. 5, when the device 22 is manufactured, at some point, all of the blocks may be usable, that is a read, write or erase operation may be performed thereupon reliably. However, more typically, even during manufacturing, some blocks are known to be defective, i.e. a read, write or erase operation cannot be performed thereupon reliably. As an example, the group of blocks 34, in FIG. 6, is shown to include defective blocks 36 and 38. Also, during manufacturing or prior to use in operation, some of the blocks of the groups of blocks 34 may be designated as 'spare' blocks, such as the blocks 40-54, shown in FIG. 7.

Next, the defective blocks 36 and 38 are replaced with the replacement blocks 44 and 46. That is, blocks 44 and 46 are no longer spare blocks and are rather blocks that will be used every time there is a need to store information into the blocks 36 and 38, respectively.

In FIG. 6, there are a total of two defective blocks and assuming there are no defective blocks in the device 24-26, the total number of defective blocks is two, this value is represented by 'MD'. Thus, 'MD' is the number of manufacturer's defects for all of the nonvolatile memory devices, such as the devices 22-26 within the device 16. '$SB_{fw}$' is the total number of spare blocks, such as the blocks 40-54 of FIG. 7, initially reserved by the controller device 20, in FIG. 7, this value is eight, as each of the blocks 40-54 are reserved as spare blocks. '$SB_{rem}$' is the total number of spare blocks remaining at the time of the measurement of the health status of the nonvolatile memory or the devices 22-26, in FIG. 8, this value is six, as blocks 40, 42, and 48-54 are the remaining total number of spare blocks. Using these values, the following equation results:

$$HS=(SB_{rem}/(SB_{fw}-MD))*100 \qquad \text{Equation(1)}$$

where HS is the health status in percentage of the nonvolatile memory of the devices 22-26. HS is rounded up to the next integer as follows: int (HS+0.5) and reported as the health status of the nonvolatile memory within the devices 22-26 to the host 12 and to a user through, perhaps, the monitor 18 or other display means as will be discussed later.

Figure 7:
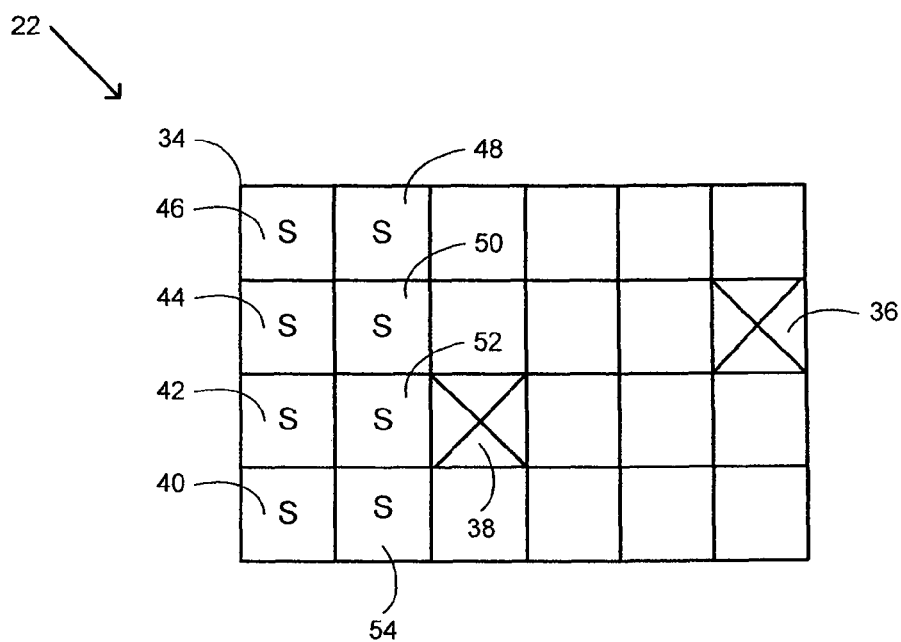
Figure 8:
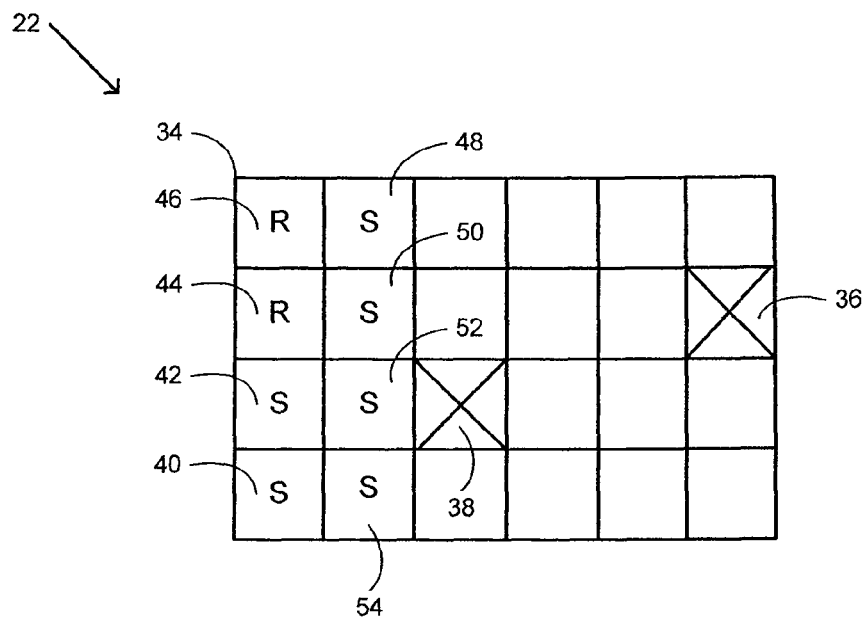

In the example of FIGS. 6-8, HS is equal to 100% because the equation is (6/(8−2))*100 or 6/6*100. Thus, the health of the nonvolatile memory of the devices 22-26 is 100% or perfect even though two manufacturing defects are noted. The health status of the present invention takes into account the manufacturing defects and is only then concerned with growing defects.

The controller device 20 of FIG. 4 generally performs the HS measurement pursuant to Equation (1), however, other devices or apparatus may do the same. For example, the nonvolatile memory device 22 or the host 12 may perform such measurement.

Alternatively, health status can be measured as a ratio in accordance with the following equation:

$$HS=(SB_{rem}/(SB_{fw}-MD)) \qquad \text{Equation(2)}$$

In Equation (2), HS is a value representing a ratio rather than a percentage of growing defects. Thus, whether HS is a percentage or a value representing a ratio, it nevertheless represents the number of growing defects on an on-going basis, as will become more evident with examples to follow.

Figure 9:
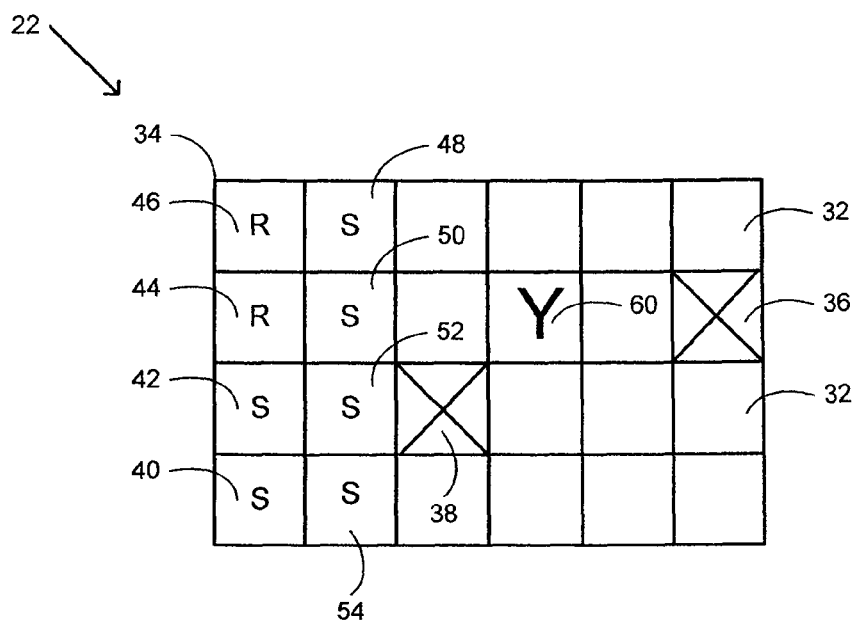
Figure 10:
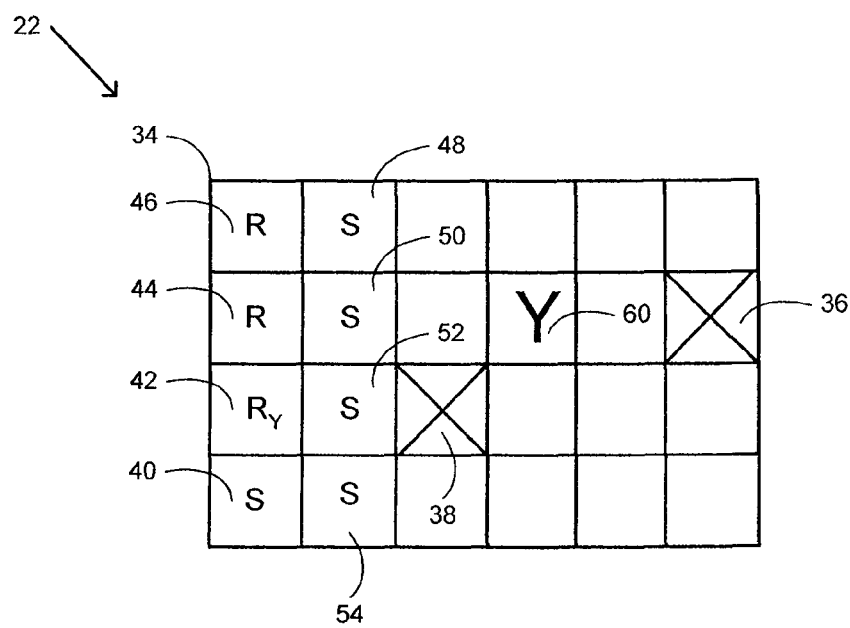
Figure 11:
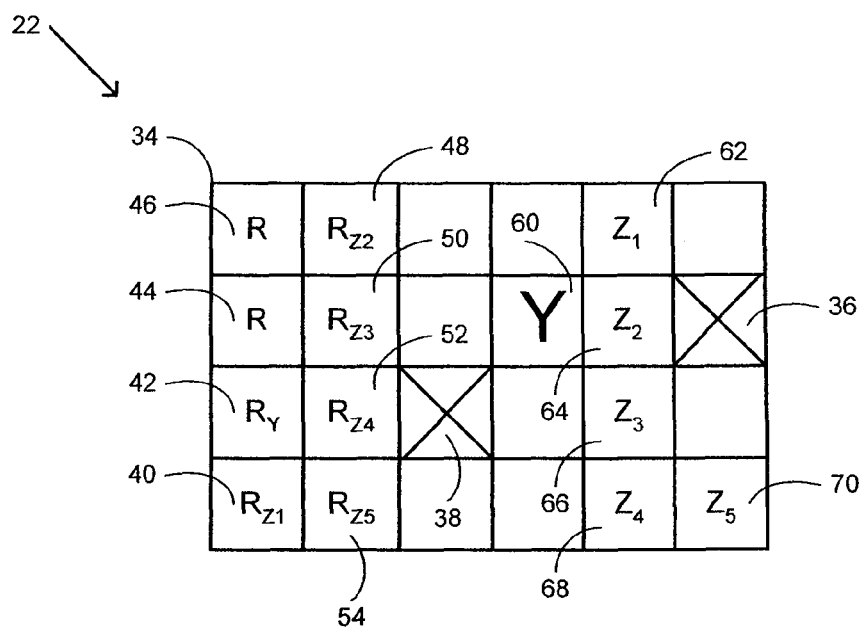

As the device 16 is used, defects grow and the HS of the device 16 will no longer remain 100%, as shown by the example of FIGS. 9-11. In FIG. 9, block 60 is noted as being defective and shown accordingly using the letter 'Y'. Thus, the block 60 is replaced with a spare block, such as the block 42, as shown in FIG. 10 by the indicator 'Ry'. FIG. 11 shows even further growth of defects of blocks 62-70, denoted as $Z_1$-$Z_5$, respectively. Each of these blocks is replaced by the blocks 40 and 48-54, respectively.

According to FIGS. 9 and 10, $SB_{rem}$ is five, $SB_{fw}$ is eight and MD is two, thus, HS is (5/(8−2))*100=83%.

However, the defects grow in FIG. 11 where $SB_{rem}$ is zero, $SB_{fw}$ is eight and MD is two, thus, HS is (0/(8−2))*100=0% indicating that the information stored in the nonvolatile memory is reliable but should not be used any further. This would perhaps invoke the 'Warning!' message on the monitor 18 in FIG. 3. In this manner, the HS represents a measure of the health of nonvolatile memory regardless of the number of manufacturing defects. Thus, different manufacturers of nonvolatile memory are on an equal playing field with respect to defect measurement, as only growing defects are accounted therefore with the value of HS.

Figure 12:
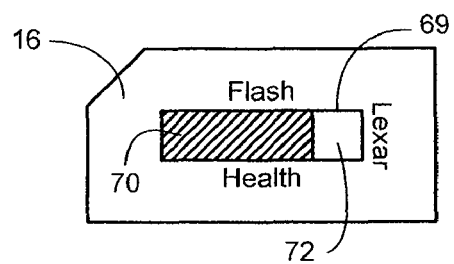
FIGS. 12-14 show examples of different ways in which HS may be displayed.
Figure 13:
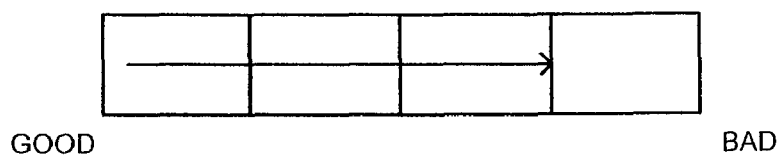
Figure 14:
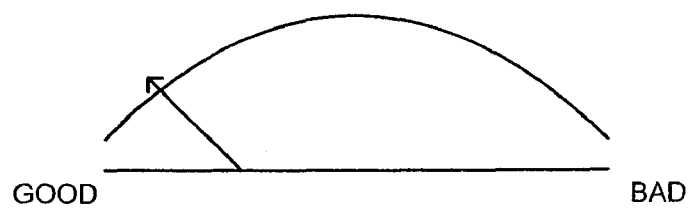

In one embodiment of the present invention, HS is displayed to a user of the system 10. FIGS. 12-14 show examples of such displays. The displays of FIGS. 12-14, in one embodiment of the present invention, are nonvolatile, i.e. they show the status of the nonvolatile memory even when power is disconnected thereto. In another embodiment of the present invention, the displays of FIGS. 12-14 are Light Emitting Diodes (LEDs) that require power applied thereto to operate. In the latter embodiment, different colors of LEDs can be employed to signify different health status. For example, a single red LED illuminated would indicate poor nonvolatile memory health. In another example, when multiple LEDs are employed, no LEDs being illuminated would indicate good nonvolatile memory health (100%) and as health deteriorates, more LED's would be illuminated, until all LEDs indicate 0%. There may also be a single multicolored LED, or multiple LED's of different colors where green would indicate a "good" status with some defined range (eg 100%) and yellow would indicate some deterioration (eg 50% to 75%) and red would indicate poor (0%).

In FIG. 12, the device 16 is shown to include a display 69 with HS being displayed in a bar fashion where the percentage of nonvolatile memory included within the device 16 that is healthy or in good condition for reading, writing and erasing is shown at 70 (the shaded area) and the rest of the display 69 shows the percentage of unhealthy memory locations within the nonvolatile memory of the device 16 at 72. Thus, if HS is 75%, the area 70 would take up three quarters of the display 69.

Similarly, FIGS. 13 and 14 show different ways of displaying the value of HS. In FIG. 13, the more defective the nonvolatile memory, the more there will be rectangular shapes displayed and in FIG. 14, the more defective the nonvolatile memory, the further the arrow will point towards 'Bad' similar to a fuel gauge.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A flash memory system comprising:
   nonvolatile memory organized into blocks, one or more of which are designated as spare blocks and one or more of which may be defective; and
   a controller coupled to the nonvolatile memory and configured to measure a health status of the nonvolatile memory, wherein the controller is also configured to output a signal indicative of a total number of spare blocks, of the one or more designated spare blocks, remaining at the time of the measurement of the health status that are not used to replace defective blocks.

2. The nonvolatile memory system of claim 1, wherein the controller device is configured to measure the health status using the equation, $HS=SB_{rem}/(SB_{fw}-MD)$, wherein HS is a health status of the nonvolatile memory, MD is a number of defects detected at a time of manufacturing of the nonvolatile memory, $SB_{fw}$ is the total number of spare blocks within the nonvolatile memory that are initially reserved as spare blocks, and $SB_{rem}$ is the total number of spare blocks, of the one or more designated spare blocks, remaining at a time of the measurement of the health status of the nonvolatile memory that are not used to replace defective blocks.

3. The nonvolatile memory system of claim 2, wherein HS is $(SB_{rem}/(SB_{fw}-MD))*100$ representing a measurement of the number of growing defects in percentage.

4. The nonvolatile memory system of claim 2, wherein HS is rounded up to the next integer as follows: int (HS+0.5).

5. The nonvolatile memory system of claim 2, wherein the value of HS is displayed to a user of the nonvolatile memory system.

6. The nonvolatile memory system of claim 1, wherein the one or more blocks which may be defective may be defective at a time of manufacturing the nonvolatile memory.

7. The nonvolatile memory system of claim 1, wherein the signal indicative of the total number of spare blocks at the time of the measurement of the health status is output to a host.

8. The nonvolatile memory system of claim 1, wherein the controller is configured to receive a signal from a host requesting the health status of the nonvolatile memory.

9. A nonvolatile memory system comprising:
   nonvolatile memory organized into blocks, one or more of which are designated as spare blocks and one or more of which may be defective at the time of manufacturing of the nonvolatile memory;
   a controller device coupled to the nonvolatile memory and configured to perform a measurement of a health status of the nonvolatile memory; and
   a display;
   wherein the display is configured to display a value indicative of a total number of spare blocks, of the one or more designated spare blocks, remaining at a time of the measurement of the health status that are not used to replace defective blocks.

10. The nonvolatile memory system of claim 9, wherein the controller device is configured to determine the total number of spare blocks, of the one or more designated spare blocks, remaining at the time of the measurement of the health status that are not used to replace defective blocks.

11. The nonvolatile memory system of claim 9, wherein the display is a nonvolatile display.

12. The nonvolatile memory system of claim 9, wherein the health status is reported to a host.

13. The nonvolatile memory system of claim 9, wherein the display is one or more light emitting diodes (LEDs).

14. A method for measuring the health of nonvolatile memory system comprising:
   noting a number of defective blocks included within nonvolatile memory;
   reserving a number of spare blocks within the nonvolatile memory;
   measuring a health status of the nonvolatile memory during operation of the nonvolatile memory by determining a number of growing defects on an on-going basis; and
   outputting a signal indicative of a total number of spare blocks, of the reserved number of spare blocks, remaining at a time of the measurement of the health status that are not used to replace the noted number of defective blocks.

15. The method of claim 14, wherein the defective blocks were defective at a time of manufacturing of the nonvolatile memory.

16. The method of claim 14, further comprising reserving the number of spare blocks within the nonvolatile memory at a time of manufacturing of the nonvolatile memory.

17. The method of claim 14, further comprising displaying a value indicative of the total number of spare blocks, of the reserved number of spare blocks, remaining at a time of the measurement of the health status that are not used to replace the noted number of defective blocks.

18. A nonvolatile memory system comprising:
a host; and
a nonvolatile memory organized into blocks, one or more of which are designated as spare blocks and one or more of which may be defective at the time of manufacturing of the nonvolatile memory, the nonvolatile memory comprising a display;
wherein a health status of the nonvolatile memory is measured by the host by determining a number of growing defects on an on-going basis; and
wherein the display is configured to display a value indicative of a total number of spare blocks, of the one or more designated spare blocks, remaining at the time of the measurement of the health status that are not used to replace defective blocks.

19. The nonvolatile memory system of claim 18, wherein the display is a nonvolatile display.

20. The nonvolatile memory system of claim 18, wherein the display is one or more light emitting diodes (LEDs).

21. The nonvolatile memory system of claim 18, wherein the display is configured to display the value indicative of the total number of spare blocks, of the one or more designated spare blocks, remaining at the time of the measurement of the health status that are not used to replace defective blocks by displaying a certain color corresponding to the total number of spare blocks, of the one or more designated spare blocks, remaining at the time of the measurement of the health status that are not used to replace defective blocks.

* * * * *